(12) United States Patent
Yoo et al.

(10) Patent No.: US 9,111,812 B2
(45) Date of Patent: Aug. 18, 2015

(54) METHOD OF MANUFACTURING FLEXIBLE DISPLAY DEVICE

(71) Applicant: LG DISPLAY CO., LTD., Seoul (KR)

(72) Inventors: Yong Woo Yoo, Goyang-si (KR); Seung Hyun Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/531,574

(22) Filed: Nov. 3, 2014

(65) Prior Publication Data

US 2015/0125972 A1  May 7, 2015

(30) Foreign Application Priority Data

Nov. 4, 2013  (KR) .................. 10-2013-0133009

(51) Int. Cl.
*H01L 21/46* (2006.01)
*H01L 27/12* (2006.01)
*H01L 21/268* (2006.01)

(52) U.S. Cl.
CPC .......... *H01L 27/1266* (2013.01); *H01L 21/268* (2013.01)

(58) Field of Classification Search
None
See application file for complete search history.

(56) References Cited

U.S. PATENT DOCUMENTS

| | | | |
|---|---|---|---|
| 2009/0011611 A1* | 1/2009 | Ichijo et al. | 438/769 |
| 2009/0085182 A1* | 4/2009 | Yamazaki et al. | 257/679 |
| 2011/0059561 A1* | 3/2011 | Liao et al. | 438/34 |
| 2013/0320317 A1* | 12/2013 | Lee | 257/40 |
| 2013/0341629 A1* | 12/2013 | Seo et al. | 257/59 |
| 2014/0002331 A1* | 1/2014 | Yoo | 345/76 |

* cited by examiner

*Primary Examiner* — Alexander Ghyka
(74) *Attorney, Agent, or Firm* — Dentons US LLP

(57) ABSTRACT

Disclosed is a flexible display device and method of manufacturing the same in which a method of manufacturing a flexible display device may include forming a sacrificial layer on a support substrate, the sacrificial layer including at least one barrier layer and a separation layer, the barrier layer having a higher hydrogen content than that of the separation layer; forming a first flexible substrate on the support substrate provided with the sacrificial layer; forming a plurality of device elements on the first flexible substrate; and irradiating a laser onto the sacrificial layer through the support substrate and separating the support substrate from the first substrate.

20 Claims, 2 Drawing Sheets

METHOD OF MANUFACTURING FLEXIBLE DISPLAY DEVICE

CROSS REFERENCE TO RELATED APPLICATIONS

This application claims the benefit of Korean Patent Application No. 10-2013-0133009, filed on Nov. 4, 2013, which is hereby incorporated by reference for all purposes as if fully set forth herein.

BACKGROUND OF THE INVENTION

1. Field of the Invention

The present application relates to a flexible display device and method of manufacturing the same, and more particularly, to a manufacturing method of a flexible display device adapted to enhance reliability and reduce defects.

2. Discussion of the Related Art

Nowadays, the display field has seen rapid development for visually representing an electrical information signal due to the wide spread of information society. In accordance therewith, a variety of flat panel display devices have been developed with such features as slimness, lightweight and low power consumption. Also, flat panel display devices have been rapidly replacing the existing cathode ray tubes (CRTs).

Examples of flat panel display devices are liquid crystal display (LCD) devices, organic light emitting display (OLED) devices, electrophoretic display (electric paper display (EPD)) devices, plasma display panel (PDPs) devices, field emission display (FED) devices, electroluminescence display (ELD) devices, elector-wetting display (EWD) devices, and so on.

Such flat panel display devices commonly include a flat display panel to realize an image. A flat display panel is typically configured with a pair of substrates that are combined to face each other, with an inherent light emitting ability or a polarizing material layer therebetween.

Also, various display devices have been actively developed to distinguished them from the existing designs, such as to enhance esthetic values and provide useful multi-functions. In general, a display device according to the related art includes a flat panel that uses a glass substrate and so on. Due to this, it is difficult to secure diversity in design. Moreover, the flat panel has different viewing distances between the central portion designed for the main viewing area and the side portion. In other words, the rigid flat panel causes a distance deviation between its central portion and its side portion with respect to the main viewing area.

To address this matter, a flexible display device using a flexible substrate made of, for example, a plastic material and so on has been developed. Such a flexible display device can be designed in a variety of shapes, which is different from the flat panel display device of the related art. Such a flexible display device is attracting public attention as the next generation display device which can replace the monitors of portable computers, electronic newspapers, smart cards and printed media such as books, newspapers, magazines and so on.

Various materials have been researched to make flexible display devices enhance esthetics value and become thinner and lighter. As such, a variety of flexible substrates are being applied to flexible display devices. Examples are a thin film metal sheet, a plastic material and so on. Since such flexible substrates are designed to be bent, it may be difficult to apply flexible substrates to the equipment used for manufacturing existing display devices, which is mainly designed for glass and quartz substrates. For example, it may be difficult for such flexible substrates to be fed by track equipment or a robot and received into a cassette or tray.

As such, flexible substrates are typically attached on a support substrate before forming device elements on their surfaces. The support substrate is used to support the flexible substrate during the formation of device elements, and then, the flexible substrate is separated from the support substrate.

In detail, the flexible substrate and the support substrate are adhered to each other with a sacrificial layer therebetween. The flexible substrate is exfoliated (or separated) from the support substrate by irradiating a laser beam onto the rear surface of the support substrate to treat the sacrificial layer. However, the sacrificial layer may not be sufficiently treated by the laser beam, when, for example, foreign materials are attached to the rear surface of the support substrate.

As a result, the device elements, which are formed on the flexible substrate at the untreated portions of the sacrificial layer, may be damaged during the separation process of the flexible substrate from the support substrate. In other words, the untreated portions may be generated in the sacrificial layer due to the foreign materials. This may cause a bright and/or dark spot in the flexible display device according to the related art.

SUMMARY OF THE INVENTION

Accordingly, the present invention is directed to a flexible display device and method of manufacturing the same that substantially obviates one or more of the problems due to limitations and disadvantages of the related art.

An advantage of the present invention is to provide a manufacturing method of a flexible display device which is adapted to enhance reliability and reduce defects during a separation process of a flexible substrate from a support substrate.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a flexible display device may, for example, include forming a sacrificial layer on a support substrate, the sacrificial layer including at least one barrier layer and a separation layer, the barrier layer having a higher hydrogen content than that of the separation layer; forming a first flexible substrate on the support substrate provided with the sacrificial layer; forming a plurality of device elements on the first flexible substrate; and irradiating a laser onto the sacrificial layer through the support substrate and separating the support substrate from the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

FIGS. 1 through 4 are cross-sectional views illustrating a method of manufacturing a flexible display device according to an embodiment of the present disclosure.

Figure 1:
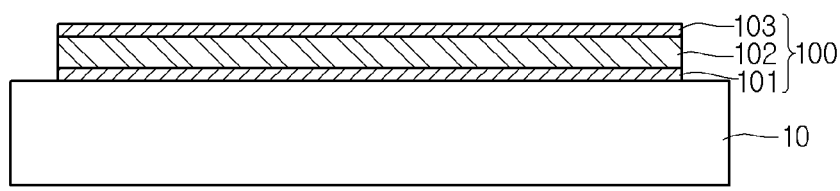
FIGS. 1 through 4 are cross-sectional views illustrating a method of manufacturing a flexible display device according to an embodiment of the present invention.

Referring to FIG. 1, a sacrificial layer 100 is formed on a support substrate 10. The sacrificial layer 100 may be formed by a CVD (chemical vapor deposition) process such as a low pressure CVD process, a plasma CVD process or other deposition methods. The support substrate 10 may be formed from a transparent material suitable to transmit light. For example, the support substrate 10 can be formed from one of glass and quartz, but it is not limited to these examples. In other words, the support substrate 10 can be formed from a variety of different materials that are suitable to support a flexible substrate during subsequent processes of forming device elements on the flexible substrate.

The sacrificial layer 100 can absorb irradiated light and allow internal cohesive force and/or interfacial adhesive strength to be decreased or extinguished. As such, layers formed on upper and lower surfaces of the sacrificial layer 100 can be easily exfoliated (or separated) from each other. A gas may be discharged from the sacrificial layer 100 when it receives a laser beam before the two layers on both surfaces of the sacrificial layer 100 can be exfoliated (or separated) from each other. In detail, irradiation of light enables not only ingredients contained in the sacrificial layer 100 to be vaporized and discharged but also an internal pressure of the sacrificial layer 100 to be generated. The internal pressure of the sacrificial layer 100 is used as a separation force for separating upper and lower surface layers of the sacrificial layer 100 from each other.

The gas discharged from the sacrificial layer 100 can be hydrogen gas. In other words, hydrogen contained in the sacrificial layer 100 vaporizes and promotes the separation of the sacrificial layer 100. As the hydrogen content of the sacrificial layer 100 increases, the refractive index and the density of the sacrificial layer 100 are lowered. As such, the sacrificial layer 100 becomes a porous film. The increased hydrogen content of the sacrificial layer 100 can decrease defects (or faults) which are caused by foreign materials when a separation process using the sacrificial layer 100 is performed later.

In order to increase the hydrogen content, the sacrificial layer 100 can be formed in a multi-layered structure, such as a double-layered structure and a triple-layered structure. The sacrificial layer 100 can be formed by stacking a first barrier layer 101, a separation layer 102 and a second barrier layer 103. Although the sacrificial layer 100 is formed in a triple-layered structure as illustrated in the drawings, it is not limited to this. For example, the sacrificial layer 100 can be formed in a double-layered structure. In other words, one of the first barrier layer 101 and the second barrier layer 103 can be removed from the sacrificial layer 100.

The separation layer 102 of the sacrificial layer 100 can be an amorphous silicon (a-Si) layer. A first gas including silane $SiH_4$ and argon Ar can be used to deposit the separation layer 102. Alternatively, a second gas including silane $SiH_4$ and hydrogen $H_2$ can be used to deposit the separation layer 102. The second gas including silane $SiH_4$ and hydrogen $H_2$ can form the separation layer 102 with a higher hydrogen content compared to the first gas including silane $SiH_4$ and argon Ar.

The first barrier layer 101 and/or the second barrier layer 103 of the sacrificial layer 100 can be formed to have a higher hydrogen content than that of the separation layer 102. In order to deposit the first and/or second barrier layer 101 and/or 103, a third gas including silane $SiH_4$, hydrogen $H_2$ and phosphine $PH_3$ can be used. The third gas including silane $SiH_4$, hydrogen $H_2$ and phosphine $PH_3$ can form a barrier layer with a higher hydrogen content by at least about 20% than that of the separation layer 102 formed by, for example, the second gas including silane $SiH_4$ and hydrogen $H_2$.

The separation layer 102 may be formed in a thickness range of about 500 Å to about 1000 Å. The first barrier layer 101 and/or the second barrier layer 103 may be formed in a thickness range of about 100 Å to about 300 Å. Also, the first barrier layer 101, the separation layer 102 and the second barrier layer 103 can be formed within the same chamber. In other words, the first barrier layer 101, the separation layer 102 and the second barrier layer 103 included in the sacrificial layer 100 can be formed within the same chamber by changing different gases injected into the chamber. As a result, the first barrier layer 101, the separation layer 102 and the second barrier layer 103 can be formed within the same chamber through the same process without any additional manufacturing process.

Figure 2:
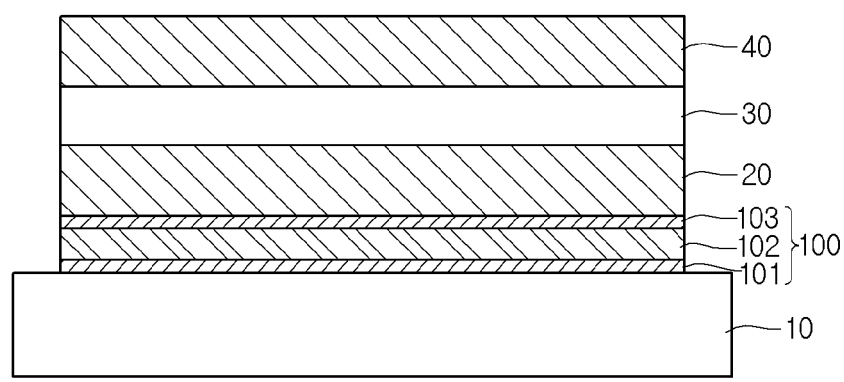

As illustrated in FIG. 2, a first substrate 20 used as a flexible substrate is attached on the support substrate 10 provided with the sacrificial layer 100. As discussed earlier, it may be difficult to apply the flexible substrates to the equipment used for manufacturing existing display devices due to its bendable characteristics, and thus device elements may not be stably formed on the flexible substrate. To address this matter, the first substrate 20 is provided on the support substrate 10 which is used to support the flexible substrate, before device elements are formed.

The first substrate 20 used as a flexible substrate may be one of a plastic substrate and a thin metal film, but it is not limited to these examples. In other words, the first substrate 20 can be formed from a variety of different materials.

Thereafter, an element layer 30 is formed on the first substrate 20. Also, a second substrate 40 is disposed (or formed) on the element layer 30. The element layer 30 includes device elements such as pluralities of thin layers and electrical elements. In detail, the element layer 30 may include a plurality of thin film transistors each configured with a gate electrode, a semiconductor layer, a source electrode and a drain electrode.

The second substrate 40 on the element layer 30 can be another flexible substrate. For example, the second substrate 40 may be one of a plastic substrate and a thin metal film, similar to the first substrate 20. However, the second substrate 40 is not limited to these examples. In other words, the second substrate 40 can be formed from a variety of different materials.

The flexible display device may be an organic light emitting display (OLED) device, a liquid crystal display (LCD) device and an electrophoretic display device. However, the flexible display device is not limited to these examples. The flexible display device according to an embodiment of the present invention may be any display device with a flexible substrate.

When the flexible display device is an OLED device, the flexible display device can include the first substrate 20, the element layer 30 formed on the first substrate 20 and configured to include thin film transistors and organic light emitting diodes, and the second substrate 40 used to encapsulate the element layer 30. In case the flexible display device is an LCD device, the flexible display device can include the first substrate 20, the element layer 30 formed on the first substrate 20 and configured to include thin film transistors, a liquid crystal layer and a color filter layer and the second substrate 40. When the flexible display device is an electrophoretic display device, the flexible display device can include the element layer 30 formed on the first substrate 20 and configured to include thin film transistors, and second substrate 40 configured with an electrophoretic film including a capsule layer.

Figure 3:
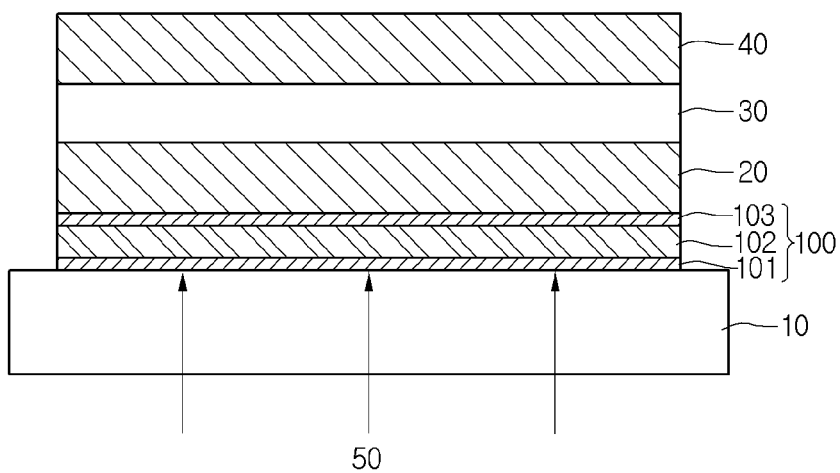

As illustrated in FIG. 3, a separation process is performed to separate the first substrate 20 from the support substrate 10 by scanning a laser beam 50 on a rear surface of the support substrate 10. The laser beam 50 is irradiated on the sacrificial layer 100 interposed between the support substrate 10 and the first substrate 20, because the laser beam 50 passes through the support substrate 10.

The irradiated laser beam 50 enables ingredients contained in the sacrificial layer 100 to be gasified and discharged. As such, an internal pressure is generated in the sacrificial layer 100. The internal pressure enables the support substrate 10 and the first substrate 20, which are formed on upper and lower surfaces of the sacrificial layer 100, to be separated from each other. At this time, hydrogen $H_2$ contained in the sacrificial layer 100 gasifies and promotes the separation (or exfoliation) of the sacrificial layer 100.

In the manufacturing method of a flexible display device according to the related art, because the laser beam 50 is irradiated on the sacrificial layer 100 through the rear surface of the support substrate 10, portions of the sacrificial layer 100, which may correspond to locations of the foreign materials on the rear surface of the support substrate 10, may not receive an enough amount of the laser beam 50 and be left with untreated portions. If such untreated portions are generated in the sacrificial layer 100, a part of the device elements on the first substrate 20 may be damaged during the separation process the first substrate 20 from the support substrate 10. In other words, defects (or faults) can be generated when separating the first substrate 20 from the support substrate 10 due to the untreated portions of the sacrificial layer 100. Such defects (or faults) may cause a bright and/or dark spot in the completed flexible display device.

On the other hand, a manufacturing method of a flexible display device according to an embodiment of the present invention may allow the sacrificial layer 100 to be easily treated by the laser beam 50 by increasing the content of hydrogen contained in the sacrificial layer 100, even when foreign materials are attached on a rear surface of the support substrate 10. This may reduce or prevent defects (or faults) which may be generated during the separation process of the flexible substrate. In order to increase the hydrogen content, the sacrificial layer 100 according to an embodiment of the present invention is formed in a multi-layered structure, such as a double-layered structure and a triple-layered structure. As illustrated in FIGS. 1 to 4, the sacrificial layer 100 may be formed by stacking the first barrier layer 101, the separation layer 102 and the second barrier layer 103. Alternatively, the sacrificial layer may be formed in a double-layered structure by stacking a single separation layer and a single barrier layer.

Figure 4:
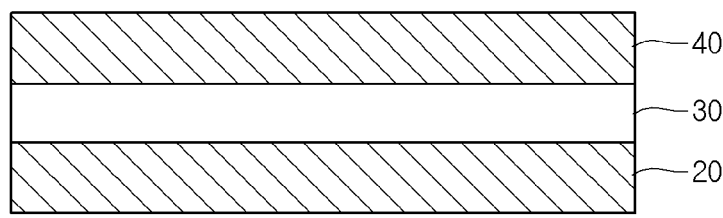

When the support substrate 10 is separated (or exfoliated) from the first substrate 20, a flexible display device including the element layer 30 interposed between the first substrate 20 and the second substrate 40 can be completed as illustrated in FIG. 4. The first substrate 20 and the second substrate 40 are formed from a material that can form a flexible substrate. The element layer 30 can include pluralities of thin layers and electrical elements. In other words, the element layer 30 can includes device elements, such as thin film transistors each configured with a gate electrode, a semiconductor layer, a source electrode and a drain electrode.

The flexible display device may be an organic light emitting display (OLED) device, a liquid crystal display (LCD) device and an electrophoretic display device. However, the flexible display device is not limited to these examples. The flexible display device according to an embodiment of the present invention may be any display device that uses a flexible substrate.

When the flexible display device is an OLED device, the flexible display device can include the first substrate 20, the element layer 30 formed on the first substrate 20 and configured to include thin film transistors and organic light emitting diodes, and the second substrate 40 used to encapsulate the element layer 30. In case the flexible display device is an LCD device, the flexible display device can include, the first substrate 20, the element layer 30 formed on the first substrate 20 and configured to include thin film transistors, a liquid crystal layer and a color filter layer, and the second substrate 40. When the flexible display device is an electrophoretic display device, the flexible display device can include the element layer 30 formed on the first substrate 20 and configured to include thin film transistors, and second substrate 40 configured with an electrophoretic film including a capsule layer.

As described above, a manufacturing method of a flexible display device according to an embodiment of the present disclosure may form a sacrificial layer between a flexible substrate and a support substrate in a multi-layered structure, such as a double-layered structure and a triple-layered structure. As a result, a sacrificial layer having a high content of hydrogen can be formed, and thus the flexible substrate can be easily separated (or exfoliated) from the support substrate by irradiating laser through the support substrate even when foreign materials are attached to a rear surface the support substrate, which may reduce defects (or faults) and/or improve reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a flexible display device, the method comprising:
    forming a sacrificial layer on a support substrate, the sacrificial layer including at least one barrier layer and a separation layer, the barrier layer having a higher hydrogen content than that of the separation layer;
    forming a first flexible substrate on the support substrate provided with the sacrificial layer;
    forming a plurality of device elements on the first flexible substrate; and
    irradiating a laser onto the sacrificial layer through the support substrate and separating the support substrate from the first substrate.

2. The method of claim 1, further comprising forming a second substrate on the plurality of device elements.

3. The method of claim 2, wherein the second substrate is a flexible substrate.

4. The method of claim 1, wherein the barrier layer includes first and second barrier layers, and wherein the separation layer is interposed between the first and second barrier layers.

5. The method of claim 1, wherein the sacrificial layer has a double-layered structure with the barrier layer and the separation layer.

6. The method of claim 5, wherein the separation layer is formed on the barrier layer.

7. The method of claim 5, wherein the barrier layer is formed on the separation layer.

8. The method of claim 1, wherein the barrier layer is formed using a first gas which includes silane $SiH_4$, hydrogen $H_2$ and phosphine $PH_3$.

9. The method of claim 8, wherein the separation layer includes amorphous silicon (a-Si).

10. The method of claim 9, wherein the separation layer is formed using a second gas which includes silane $SiH_4$ and argon Ar.

11. The method of claim 9, wherein the separation layer is formed using a third gas which includes silane $SiH_4$ and hydrogen $H_2$.

12. The method of claim 1, wherein the separation layer of the sacrificial layer is formed in a thickness range of about 500 Å to about 1000 Å.

13. The method of claim 1, wherein the barrier layer of the sacrificial layer is formed in a thickness range of about 100 Å to about 300 Å.

14. The method of claim 1, wherein the barrier layer and the separation layer are formed within a same chamber.

15. The method of claim 14, wherein the barrier layer and the separation layer are formed within the same chamber by changing gases.

16. The method of claim 1, wherein the barrier layer has a higher hydrogen content by about at least 20% than that of the separation layer.

17. The method of claim 1, wherein the first flexible substrate is one of a plastic substrate and a thin metal film.

18. The method of claim 1, wherein the plurality of device elements include pluralities of thin layers and electrical elements.

19. The method of claim 1, wherein the plurality of device elements include thin film transistors each configured with a gate electrode, a semiconductor layer, a source electrode and a drain electrode.

20. The method of claim 1, wherein the flexible display device is one of an organic light emitting display (OLED) device, a liquid crystal display (LCD) device and an electrophoretic display device.

* * * * *